(12) United States Patent
Fukunaga et al.

(10) Patent No.: US 6,176,929 B1
(45) Date of Patent: *Jan. 23, 2001

(54) THIN-FILM DEPOSITION APPARATUS

(75) Inventors: Yukio Fukunaga, Yokohama; Hiroyuki Shinozaki, Fujisawa; Kiwamu Tsukamoto, Chigasaki; Mitsunao Shibasaki, Ebina; Kuniaki Horie, Yamato; Hiroyuki Ueyama, Fujisawa; Takeshi Murakami, Tokyo, all of (JP)

(73) Assignee: Ebara Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/118,177

(22) Filed: Jul. 17, 1998

(30) Foreign Application Priority Data

Jul. 22, 1997 (JP) .................................................. 9-211338
Jul. 22, 1997 (JP) .................................................. 9-211339

(51) Int. Cl.$^7$ .................................................. C23C 16/00
(52) U.S. Cl. .................................................. 118/715; 118/719
(58) Field of Search .............................. 156/345; 118/715, 118/719

(56) References Cited

U.S. PATENT DOCUMENTS

| | | | |
|---|---|---|---|
| 4,798,165 | 1/1989 | deBoer et al. | 118/715 |
| 5,552,017 | * 9/1996 | Jang et al. | 156/643.1 |
| 5,558,717 | * 9/1996 | Zhao et al. | 118/715 |
| 5,728,223 | 3/1998 | Murakami et al. | 118/715 |
| 5,755,886 | * 5/1998 | Wang et al. | 118/715 |
| 5,885,356 | * 3/1999 | Zhao et al. | 118/723 R |
| 5,961,850 | * 10/1999 | Satou et al. | 216/67 |
| 5,964,947 | * 10/1999 | Zaho et al. | 118/715 |

FOREIGN PATENT DOCUMENTS

| | | |
|---|---|---|
| 8-227859 | 9/1996 | (JP) . |
| 2584960 | 11/1996 | (JP) . |
| 8-337876 | 12/1996 | (JP) . |
| 9-2896 | 1/1997 | (JP) . |

* cited by examiner

Primary Examiner—Jeffrie R. Lund
(74) Attorney, Agent, or Firm—Wenderoth, Lind & Ponack, L.L.P.

(57) ABSTRACT

A compact thin-film deposition apparatus can promote a stable growth of a high quality thin-film product of uniform quality. The apparatus comprises a vacuum-tight deposition chamber enclosing a substrate holding device for holding a substrate. An elevator device for moving the substrate holding device and a gas showering head for flowing a film forming gas towards the substrate are provided. A transport opening and an exhaust opening are provided on a wall section of the deposition chamber at a height corresponding to the transport position and the deposition position, respectively. The deposition chamber is provided with a flow guiding member, and the flow guiding member comprises a cylindrical member to surround an elevating path of the substrate holding device and a first ring member to vertically divide a chamber space at a height between the exhaust opening and the transport opening.

32 Claims, 10 Drawing Sheets

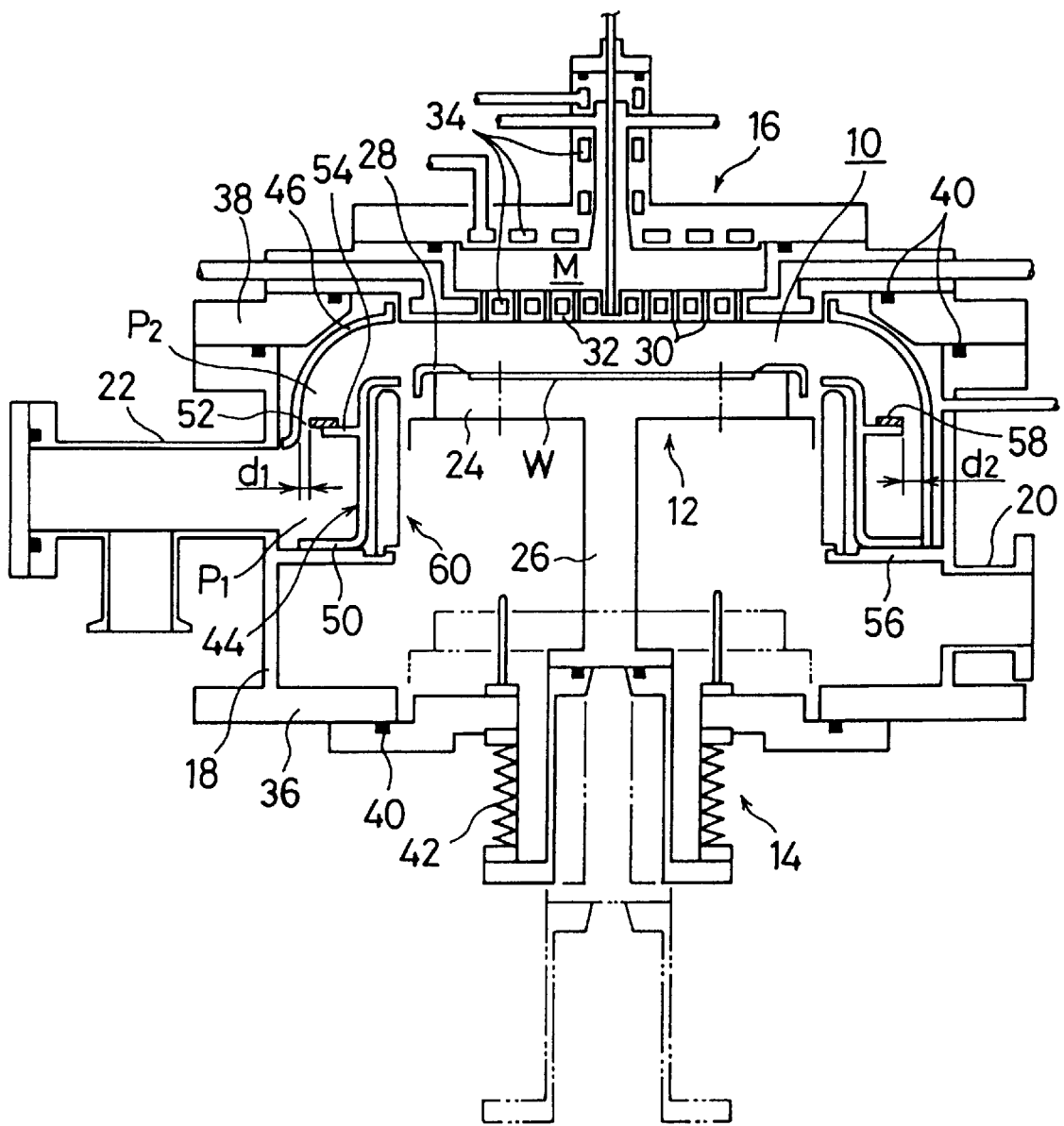
F I G. 2

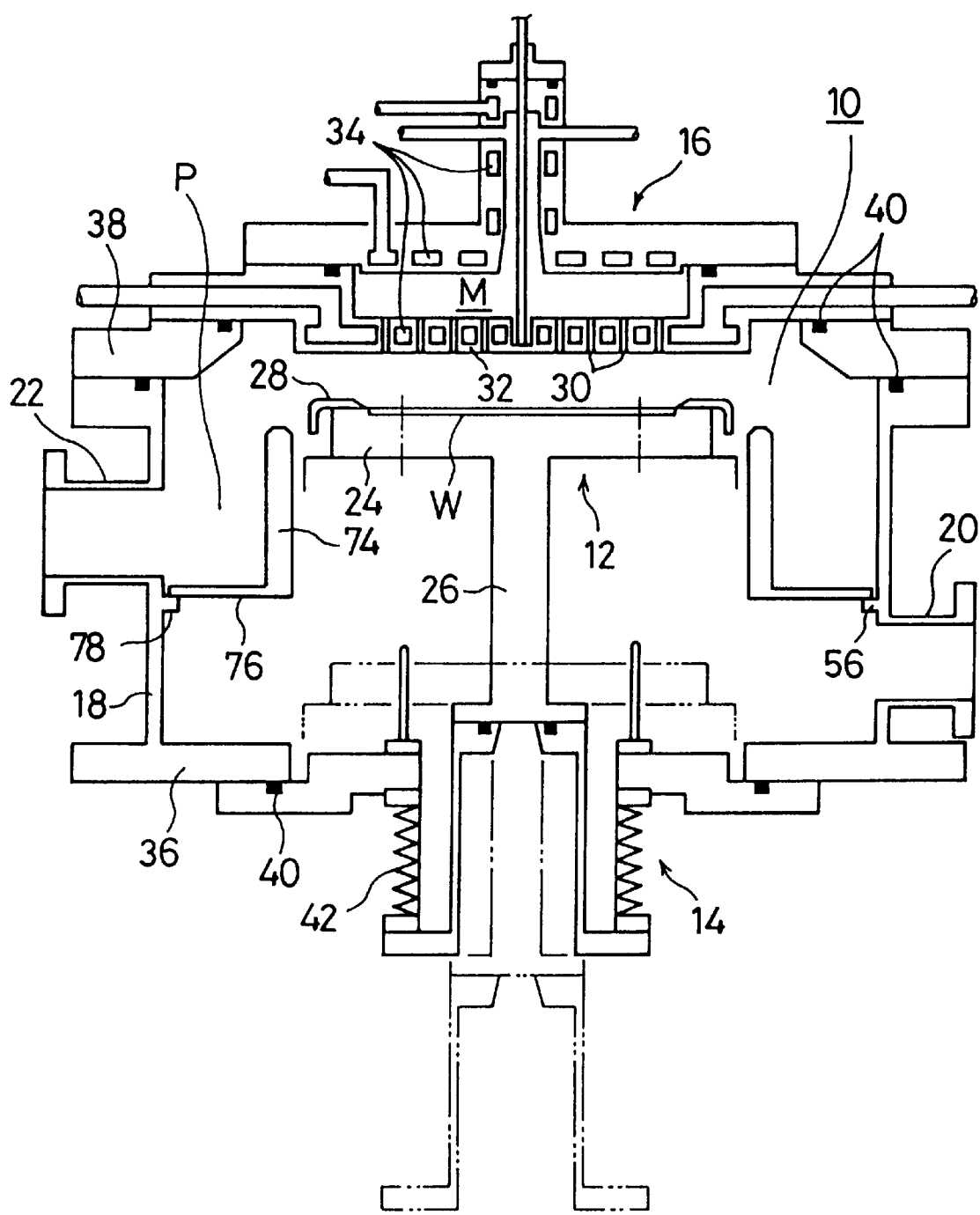
F I G. 4

$r + e_1 \leq R$ $r < R$

THIN-FILM DEPOSITION APPARATUS

BACKGROUND OF THE INVENTION

1. Field of the Invention

The present invention relates in general to a chemical vapor deposition (CVD) depositing thin-films, in a vapor phase reaction, of a highly dielectric or ferroelectric substance such as barium/strontium titanate on a substrate such as a semiconductor wafer.

2. Description of the Related Art

In recent years, there has been a quantum jump in circuit density of integrated circuit devices produced by the semiconductor industries, and intense development activities are underway in anticipation of giga-bit order DRAMs replacing the prevailing mega-bit order DRAMs of today. Dielectric thin-film materials used to make high capacitance devices necessary for producing DRAMs have, in the past, included silicon oxide or silicon nitride films with a dielectric constant of less than 10, and tantalum pentaoxide ($Ta_2O_5$) films with a dielectric constant of less than 20. However, newer materials such as barium titanate ($BaTiO_3$), strontium titanate ($SrTiO_3$) or barium/strontium titanate (($BA,Sr)TiO_3$) appear to be more promising.

When growing such a metal oxide thin-film on a substrate in a vapor phase chemical reaction, the substrate is placed on a susceptor disposed in a vacuum-tight film deposition chamber, and the substrate is heated, by such means as a heater enclosed in the susceptor, to a specific temperature, and a mixture of a feed gas and a reactant gas (oxygen-containing) is ejected onto the substrate through a gas showering head.

To produce a thin-film of a uniform quality using such a method, careful consideration must be given to managing the process of flowing the gaseous mixture over the substrate, which means that not only does the routing pattern from the gas showering head to the substrate become an important parameter, but also the overall flow process, including the effect of the spent gas exhaust path in the film deposition chamber.

For example, it may seem desirable to place a spent gas exhaust opening directly below a pedestal which supports the substrate so as to form an axisymmetric pattern of flow of the film forming gas enveloping the substrate. However, such an arrangement is not only difficult to do, because of the presence of other components associated with the pedestal such as a pedestal support shaft and an elevating device, but it increases the length of the flow path within the chamber, leading to a problem of precipitation and adhesion of reaction products that could become a potential source of contamination in the deposited films. On the other hand, an arrangement may be considered in which a plurality of exhaust openings are provided symmetrically around the outer periphery of the substrate holder to produce a symmetrical flow pattern of the film forming gas over the substrate, but such a design would lead to an expanded apparatus requiring a large floor space, and also would lead to a difficulty of mechanical interference with the exhaust openings and a substrate transport exit opening.

Therefore, it is a first object of the present invention to provide a compact thin-film deposition apparatus which promotes stable growth of a high quality thin-film product of uniform quality.

Furthermore, one of the characteristics of a feed material is that after the feed liquid is vaporized, the range of stability of the feed vapors is extremely narrow such that the vapors are condensed when the ambient temperature is low and the vapors are decomposed when the ambient temperature is high. The present inventors had proposed a method in a Japanese Patent Application, Laid-Open Publication H9-2896, to counter the difficulties posed by such a narrow stability range of vapors by controlling the inner wall temperature of the deposition chamber at a certain temperature close to the vaporization temperature. It has been found that, although it is possible to effectively suppress the formation of reaction products, such products cannot be eliminated completely and fine particles are produced and become attached to the inner walls of the deposition chamber.

In the course of conducting thermal analyses of the feed materials, it was found that precursors of each of the liquid feed materials for BST or SBT, for example, do not have a complete and clear temperature range where all three materials can remain in a stable gaseous state, resulting in condensation or decomposition of at least a portion of the feed vapor. It was also discovered that condensed and adhered products are easy to wash off when compared with decomposed and adhered products.

Therefore, it is a second object of the present invention to provide a deposition apparatus which produces a high quality and uniform thin-film product while avoiding decomposition of the feed vapor at high temperatures.

SUMMARY OF THE INVENTION

The first object outlined above has been achieved by a thin-film deposition apparatus comprising: a vacuum-tight deposition chamber enclosing a substrate holding device for holding a substrate; an elevator device to raise or lower the substrate holding device between a deposition position and a transport position; a gas showering head for flowing a film forming gas towards the substrate; a transport opening provided on a wall section of the deposition chamber at a height corresponding to the transport position; and an exhaust opening provided on the wall section at a height between the deposition position and the transport position. The deposition chamber is provided with a flow guiding member, the flow guiding member comprising a cylindrical member to surround an elevating path of the substrate holding device, and a first ring member to vertically divide a chamber space at a height between the exhaust opening and the transport opening.

Accordingly, by dividing the chamber space into two spaces where one is for the thin film deposition process and the other is a working space for delivery of the substrate, the gas flow is effectively controlled to provide a stable deposition condition. Further, by forming an annular flow path to guide a spent gas to the exhaust gas opening by the flow guiding member, the non-uniform flow of film forming gas over the substrate due to an uneven arrangement of an exhaust opening is minimized, thereby providing a thin-film product of a highly uniform quality with a compactly designed apparatus.

In the apparatus presented above, an outer flow guiding member may be disposed between the flow guiding member and an inner surface of the wall section to form an exhaust passage for spent gases in association with the flow guiding member. It is advantageous to have the flow guiding member and the outer flow guiding member be easily removable from the deposition chamber.

In the apparatus presented above, a second ring member may be disposed above the first ring member covering the annular flow path so as to form a circumferential slit channel for communicating the chamber space with the annular flow path. The first ring member may be formed to extend from the flow guiding member. The circumferential slit channel may be shaped in such a way that a slit width in a vicinity of the exhaust opening is narrower than a slit width remote from the exhaust opening. There may be only one exhaust opening in a circumferential direction.

A flow adjusting ring may be placed on the second ring member so that the slit size can be adjusted to produce a uniform flow over the substrate. The outer flow guiding member may be shaped in a curved shape following the configuration of an inner surface of the deposition chamber. The material for the flow guiding member may be quartz or a metal such as stainless steels or aluminum.

A cylindrical wall member surrounding the substrate holding device may be provided, and the flow guiding member may be provided on an outer circumference of the cylindrical wall member. The cylindrical wall member may comprise an insulator member for suppressing radiation heat from the substrate holding device, and the insulator member may be provided with a temperature control device to control the cylindrical wall member at a specific temperature. The temperature control device may be provided with a thermal medium passage formed within the cylindrical wall member and an external thermal medium supply apparatus to supply a thermal medium at a controlled temperature.

In another aspect of the invention, a thin-film deposition apparatus comprises: a cylindrical vacuum-tight deposition chamber enclosing a substrate holding/heating device; an elevator device to raise or lower the substrate holding/heating device between a deposition position and a transport position; a gas showering head for flowing a film forming gas from a top of the deposition chamber towards the substrate; a transport opening provided on a wall section of the deposition chamber at a height corresponding to the transport position; and an exhaust opening provided on a wall section of the deposition chamber at a height between the deposition position and the transport position, wherein a cylindrical thermal insulator member is disposed to surround the substrate holding/heating device placed at the deposition position.

Accordingly, the thermal insulator member suppresses radiation heat from the substrate holding/heating device, and prevents the interior of the deposition chamber from reaching a temperature above the decomposition temperature of the feed material. Therefore, the feed material is prevented from decomposing and sticking when coming into contact with hot regions. If the feed material does condense on interior regions, it can be washed off and apparatus operation can be resumed. It is preferable to make the insulator member from thermal insulating materials such as quartz, stainless steels or ceramics.

The thermal insulator member may be provided with a temperature control device for controlling the thermal insulator member at a predetermined temperature. The temperature control device may be constructed with a thermal medium passage formed inside the insulator member and an external thermal medium supply device to supply a medium at a controlled temperature.

The thermal insulator member may be disposed in the deposition chamber in a detachable manner. The apparatus may be provided with a cooling device to cool the wall section of the deposition chamber to a temperature lower than a specific temperature. The apparatus also may be provided with a cooling device to cool the wall section of the deposition chamber to a temperature lower than a predetermined temperature.

In another aspect of the invention, a thin-film deposition apparatus comprises: a cylindrical vacuum-tight deposition chamber enclosing a substrate holding device for holding a substrate; an elevator device to raise or lower the substrate holding device between a deposition position and a transport position; a gas showering head having a nozzle plate for flowing a film forming gas from a top of the deposition chamber towards the substrate; a transport opening provided on a wall section of the deposition chamber corresponding to a height of the transport position; and an exhaust opening provided on the wall section at a height between the deposition position and the transport position, wherein the exhaust opening is formed substantially in one circumferential location, and a center of gas flow density of a gas flowing out of the gas showering head is offset from a center of the substrate held on the substrate holding device horizontally, in a direction opposite to the exhaust opening.

Accordingly, a non-uniform gas flow density of film forming gas over the substrate due to an uneven arrangement of an exhaust opening is compensated for, thereby providing a thin-film product of highly uniform thickness with a compactly designed apparatus.

The above-mentioned can be done by arranging a center of a nozzle region of the nozzle plate to be offset from a center of the substrate held on the substrate holding device horizontally, in a direction opposite to the exhaust opening, or by making a nozzle hole distribution where a larger number of nozzle holes are provided on the side opposite to the exhaust opening than on the other side.

It is recommendable to provide the gas showering head with a temperature control device for controlling the nozzle plate at a predetermined temperature by using a thermal medium. The nozzle plate may be provided with a nozzle area larger than the substrate.

BRIEF DESCRIPTION OF THE DRAWINGS

FIG. 2 is a cross sectional view of a second embodiment of the thin-film deposition chamber of the present invention;

FIG. 4 is cross sectional view of a fourth embodiment of the thin-film deposition chamber of the present invention;

DESCRIPTION OF THE PREFERRED EMBODIMENTS

Figure 1A:
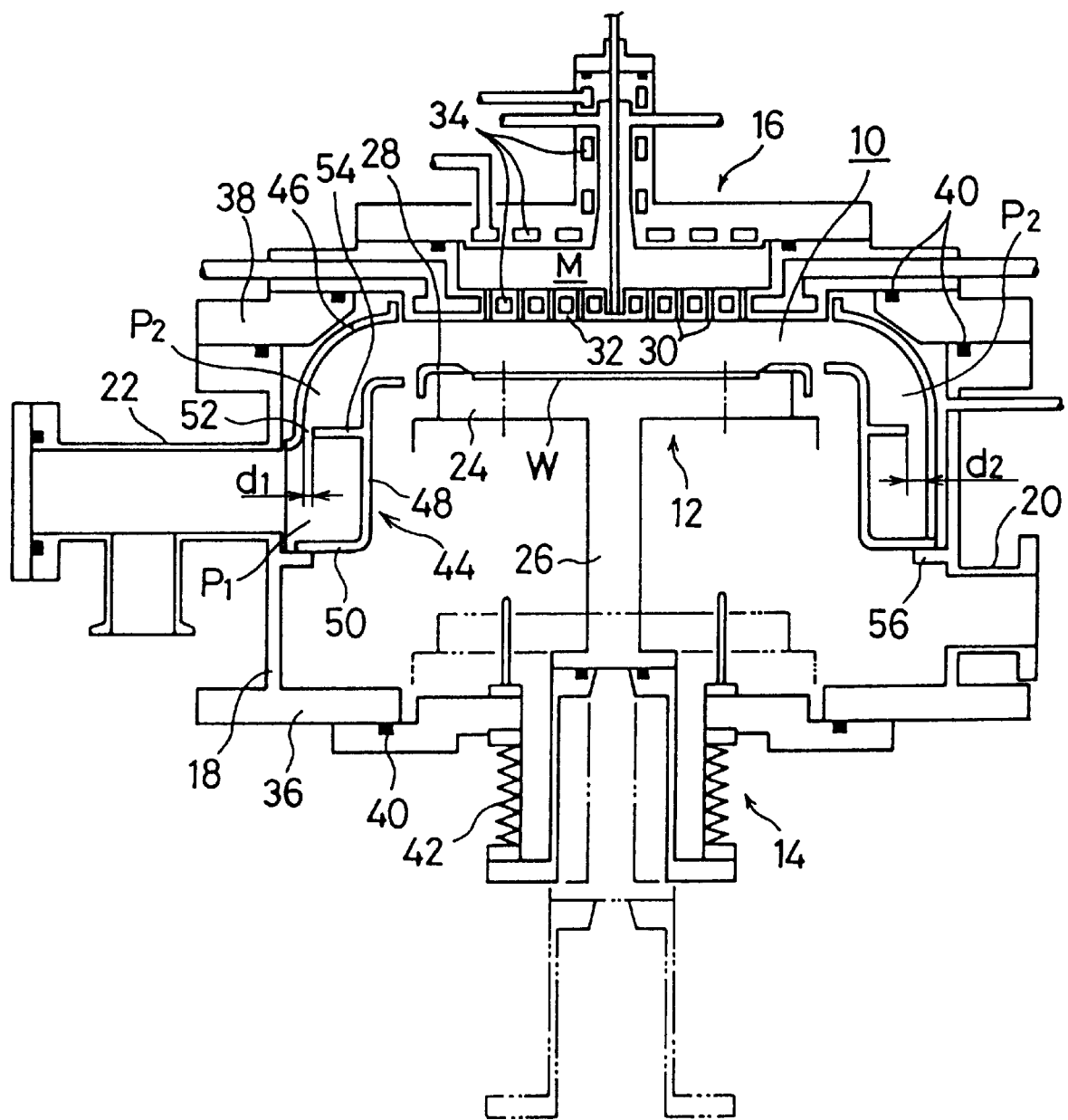
FIG. 1A is a cross sectional view of a first embodiment of a thin-film deposition chamber of the present invention.

FIG. 1A shows a first embodiment of the thin-film deposition apparatus comprising a vacuum-tight deposition chamber 10 having an overall cylindrical shape and including: a substrate holder 12 for holding a substrate W; an elevator device 14 for raising or lowering the holder 12 between a deposition position close to an upper limit and a transport position close to a lower limit; a gas showering head 16 for flowing feed gas towards the substrate W from the top of the deposition chamber 10; a transport opening 20 formed on a wall section 18 of the deposition chamber 10 at a height corresponding with the transport position; and an exhaust opening 22 formed on the wall section 18 of the deposition chamber 10 at a height between the deposition position height and the transport position height. One exhaust opening 22 and one transport opening 20 are provided separately at suitable circumferential positions.

The substrate holder 12 comprises a circular disk shaped susceptor 24 having an internal heater (not shown) and a support rod 26 connected to the elevator device 14. The outer peripheral edge of the susceptor 24 has an annular deposit-blocking plate 28 with an L-shape cross-section to prevent deposition of reaction products. The gas showering head 16 has a nozzle plate 32 with a circular shape and a size slightly larger than the substrate W, and numerous nozzle holes 30 are evenly distributed at a nozzle region 33 which is a central area excepting a narrow peripheral region of the nozzle plate 32. Also, in this case, the deposition chamber 10 is provided with a mixing space for mixing a feed gas with a reactant gas (oxidizing gas for example), and a jacket heater (temperature control device) 34 for maintaining the nozzle holes 30 and the mixing space at a certain temperature.

The deposition chamber 10 comprises: the cylindrical wall section 18; a bottom plate 36 having a central opening section for receiving the elevator device 14; the gas showering head 16 serving also as the ceiling for the chamber 10; and a tapered block 38 fitting between the wall section 18 and the gas showering head 16 and constituting a taper section. The deposition chamber 10 includes other components such as O-rings 40 as seals, bellows 42 where necessary, and gates (not shown) for shutting the transport opening 20. In this embodiment, a temperature control device in the form of thermal medium passages is not provided on the side wall section 18 and the bottom plate 36.

The deposition chamber 10 is provided with two flow guiding plates 44,46 to form passages P1, P2 to guide the spent exhaust gas to the exhaust opening 22. Passage P1 comprises: the inner flow guiding plate 44; a cylindrical member 48 surrounding the elevating path for the substrate holder 12; a first ring member 50 to divide the chamber space vertically at a height between the exhaust opening 22 and the transport opening 20; and a second ring member 54 having an annular slit to form a slit channel 52 communicating throughout the outer flow guiding plate 46. The outer flow guiding plate 46 is formed along the inside wall of the deposition chamber 10 and forms the exhaust passage P2 by pairing with the inner flow guiding plate 44 to guide the reacted gas to the exhaust opening 22.

The slit channel 52 is for preventing uneven flow of gas caused by the fact that there is only one exhaust opening 22, and is designed so that the slit width becomes narrower as it approaches the exhaust opening 22. In other words, the slit width $d_1$ at the exhaust opening 22 is the minimum width and slit width $d_2$ at the opposite end is the maximum width. The top end of the inner flow guiding plate 44 extends inward, and performs a function of narrowing the space between the susceptor 24 in conjunction with the deposit-blocking plate 28. The inner and outer flow guiding plates 44,46 are seated on an annular protrusion section 56 without any fixing mechanism. Therefore, the flow guiding plates 44, 46 can easily be removed from the deposition chamber 10 for cleaning and exchanging purposes just by picking them up after removing the gas showering head 16 at the top and the taper block 38.

The operation of the thin-film deposition apparatus so constructed will be explained. The susceptor 24 is placed in the transport position, shown by a double-dotted line in FIG. 1A, and a substrate W is loaded thereon from the transport opening 20 by a robot hand (not shown), and the substrate W is raised by the elevator device 14 to the deposition position shown by a solid line in FIG. 1A. The substrate W is heated to a deposition temperature using the susceptor 24, and a gaseous mixture of feed gas and reactant gas is supplied from the gas showering head 16 which is kept at a specific temperature by a circulating thermal medium.

The feed gas and the reactant gas react on the substrate W to form a thin-film deposit on the substrate W, and the spent gas is directed radially over the substrate W to flow into the exhaust passage P2 formed by the inner and outer flow guiding plates 44,46. The spent gas continues to be exhausted through the slit channel 52 into the annular flow passage $P_1$ and is removed from the exhaust opening 22. Even though there is only one exhaust opening, because the slit width of the slit channel 52 becomes narrower towards the exhaust opening 22, uniform radial flow is generated around the circumference of the substrate W, thereby producing a deposit of uniform quality in radial as well as circumferential directions on the substrate W.

Also, because of the presence of the inner flow guiding plate 44, the flow path of the reactant gas is restricted so that it is difficult for the gas to reach the back of the susceptor 24 and the bottom portions of the elevator device 14. Therefore, adhesion of reaction products and a potential source of contamination due to such products are prevented. If the feed material and reaction products become adhered to the flow guiding plates 44,46, they can be removed and exchanged with new ones by stopping the operation and removing the gas showering head 16 at the top of the deposition chamber 10 and the taper block 38, so that the operation can be resumed.

Figure 1B:
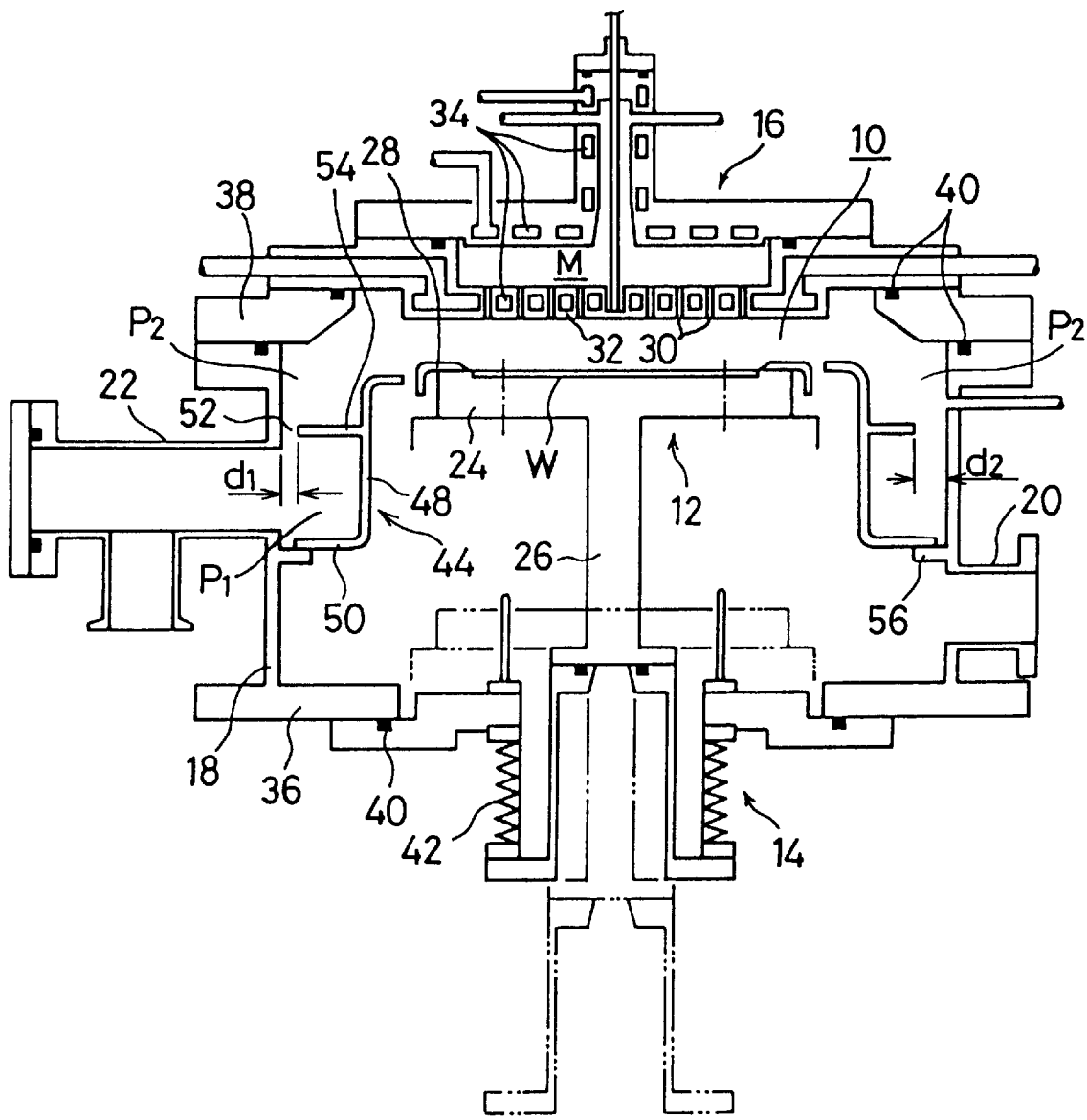
FIG. 1B is a cross sectional view of a minor modification of the first embodiment of the thin-film deposition chamber of the present invention.

FIG. 1B has a similar construction with the embodiment described above, where the outer flow guiding plate 46 is omitted.

FIG. 2 shows a second embodiment of the deposition apparatus. In this embodiment, the second ring member 54 of the inner flow guiding plate 44 is separated at a uniform distance from the outer flow guiding plate 46, but a flow adjusting ring 58 is provided on top of the second ring member 54 so as to enable the clearance $d_1$ at the exhaust opening 22 and the clearance $d_2$ at the opposite end to be in a relation $d_1<d_2$. Uniform flow of gas, to suit the operating conditions, can be produced by adjusting the shape of the flow adjusting ring 58 or by placing the flow adjusting ring 58 eccentrically on the second ring member 54. Also, in this case, a cylindrical thermal insulator 60 is provided between the inner flow guiding plate 44 and the susceptor 24 to prevent a temperature increase of the flow guiding plates 44, 46 by radiation from the susceptor 24.

Figure 3:
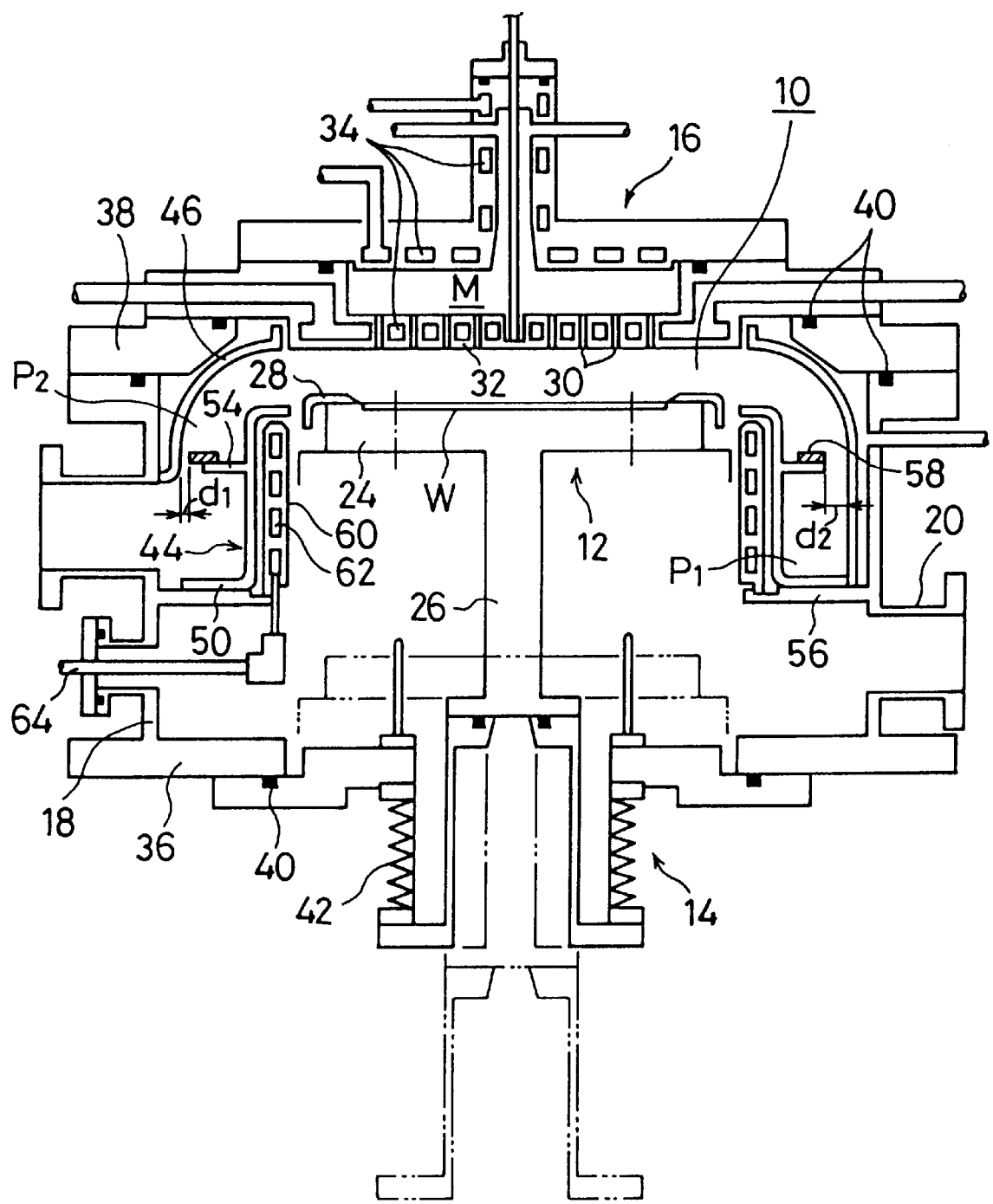
FIG. 3 is cross sectional view of a third embodiment of a thin-film deposition chamber of the present invention.

FIG. 3 shows a third embodiment of the deposition apparatus. In this embodiment, the insulator 60 has an internal fluid passage 62 for flowing a thermal medium. A thermal medium is supplied from an external supply source by connecting a supply pipe 64 and a return pipe to the insulator 60. The performance of the flow guiding plates 44, 46 is further improved with this arrangement of absorbing the radiation in the thermal cooling medium, so that the deposition chamber temperature can be optimized.

FIG. 4 shows a fourth embodiment of the thin-film deposition apparatus. The deposition chamber 10 in this apparatus does not have flow guiding plates but a thermal insulator member 74 is provided surrounding the elevator path for the substrate holder 12. The thermal insulator member 74 is made of such materials as quartz, stainless steels or ceramics and is integrally formed with an annular base 76 which extends out at the base section. The insulator member 74 is disposed inside the deposition chamber 10 by seating it on an annular protrusion 78 which is formed on the wall section 18 below the exhaust opening but above the transport opening. Therefore, the insulator member 74 can be readily removed from the deposition chamber 10 by removing the gas showering head 16 at the top and the taper block 38.

The operation of the deposition apparatus so constructed will be explained. The susceptor 24 is placed in the transport position, shown by a double-dotted line in FIG. 4, and a substrate W is loaded thereon from the transport opening 20, and the substrate W is raised by the elevator device 14 to the deposition position shown in FIG. 4. The substrate W is heated to a deposition temperature using the susceptor 24, and a gaseous mixture of feed gas and reactant gas is ejected from the gas showering head 16, which is kept at a specific temperature by means of a circulating thermal medium, towards the substrate W.

The feed gas and the reactant gas react on the substrate W to form a deposit on the substrate W, and the spent gas is directed radially over the substrate W to flow into an exhaust passage P formed by the wall section 18 of the chamber 10 and the annular insulator member 74, and is exhausted from the exhaust opening 22. The passage of the reacted gas is restricted by the insulator member 74 and the annular base 76 so that gas flow to the back of the susceptor 24 and to the elevator device 14 and other regions disposed below the chamber 10 is made difficult, thereby preventing particle adherence and a possible source of contamination caused by such particles.

During the film forming reaction, the insulator member 74 suppresses radiation from the substrate holder 12 to prevent the wall section 18 of the chamber 10 to be heated above the decomposition temperature of the feed material, thereby preventing the feed material from decomposing and sticking to these places. When condensation of the feed material does occur in such places, the gas showering head 16 and the taper block 38 can be removed through the top of the chamber 10 so that the interior of the chamber 10 can be washed before resuming the deposition process.

Figure 5:
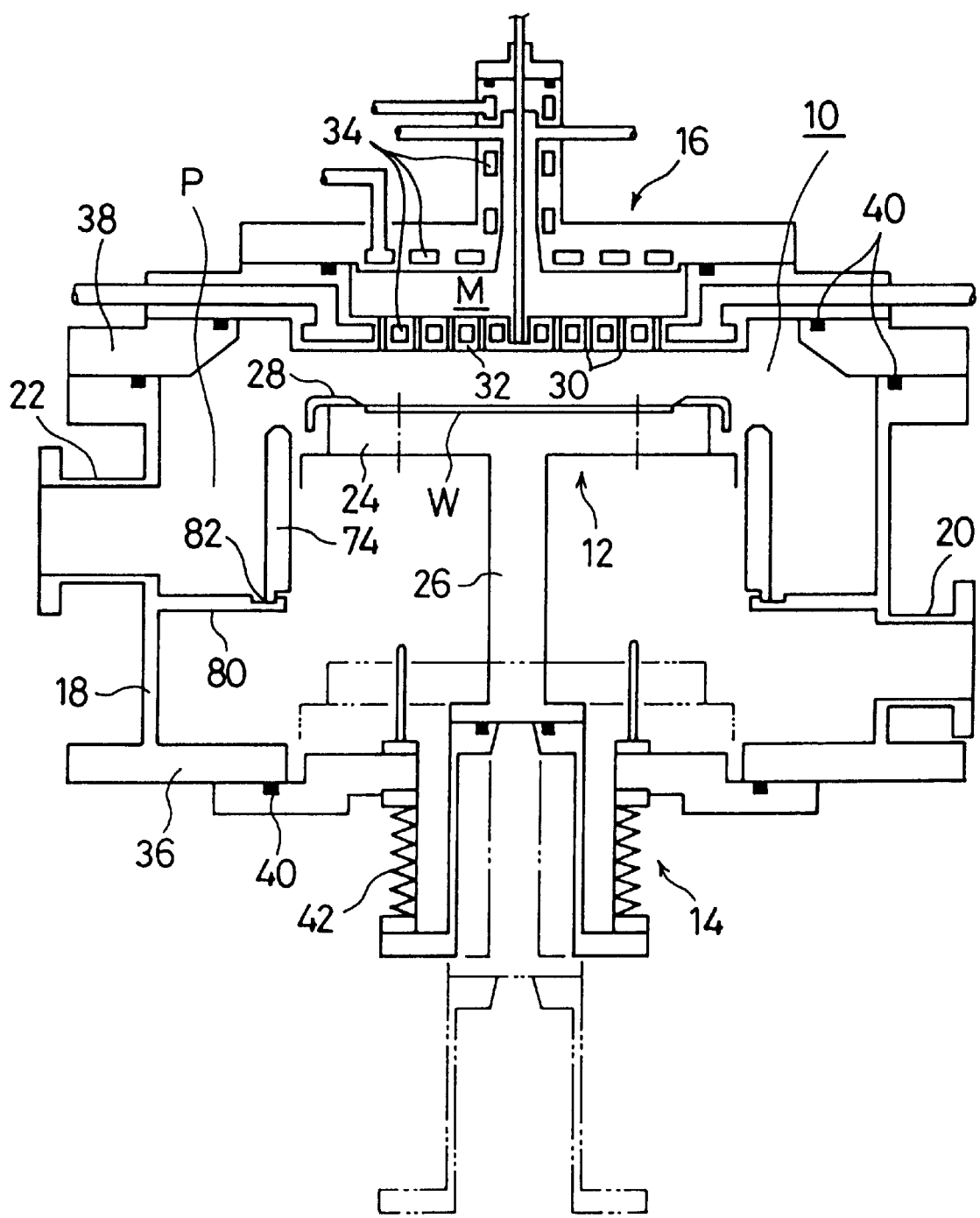
FIG. 5 is cross sectional view of a fifth embodiment of the thin-film deposition chamber of the present invention.

FIG. 5 shows a fifth embodiment of the thin-film deposition apparatus. The insulator member 74 is a simple cylindrical member and is detachably seated on an annular groove 82 provided on the inner surface of the wall section 18. In this embodiment, the shape is made simpler and more compact than the previous insulator ring so that not only manufacturing of the insulator member 74 is easy, but the removal and exchange steps become much easier. This is especially desirable when it is necessary to change the material that the insulator member 74 is made of to suit the film deposition process.

Figure 6:
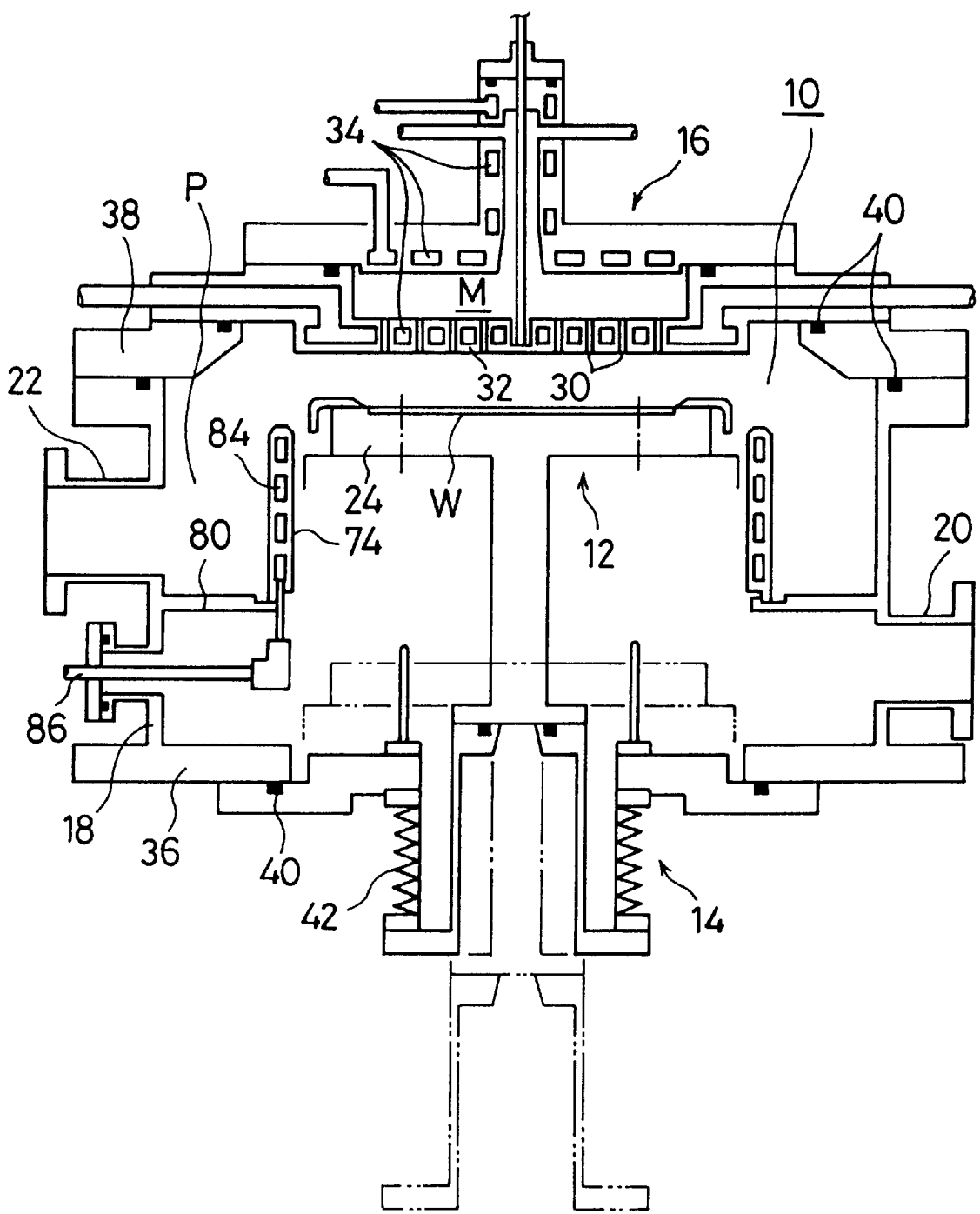
FIG. 6 is cross sectional view of a sixth embodiment of the thin-film deposition chamber of the present invention.

FIG. 6 shows a sixth embodiment of the deposition apparatus. In this case, a thermal medium passage 84, for flowing a thermal medium such as oil, is provided inside the insulator member 74. The thermal medium is supplied from an external supply source by connecting a supply pipe 86 and a return pipe to the insulator 74. The ability to control temperature rise in the wall section 18 is further improved because of the absorption of the radiation from the interior of the deposition chamber 10.

Figure 7:
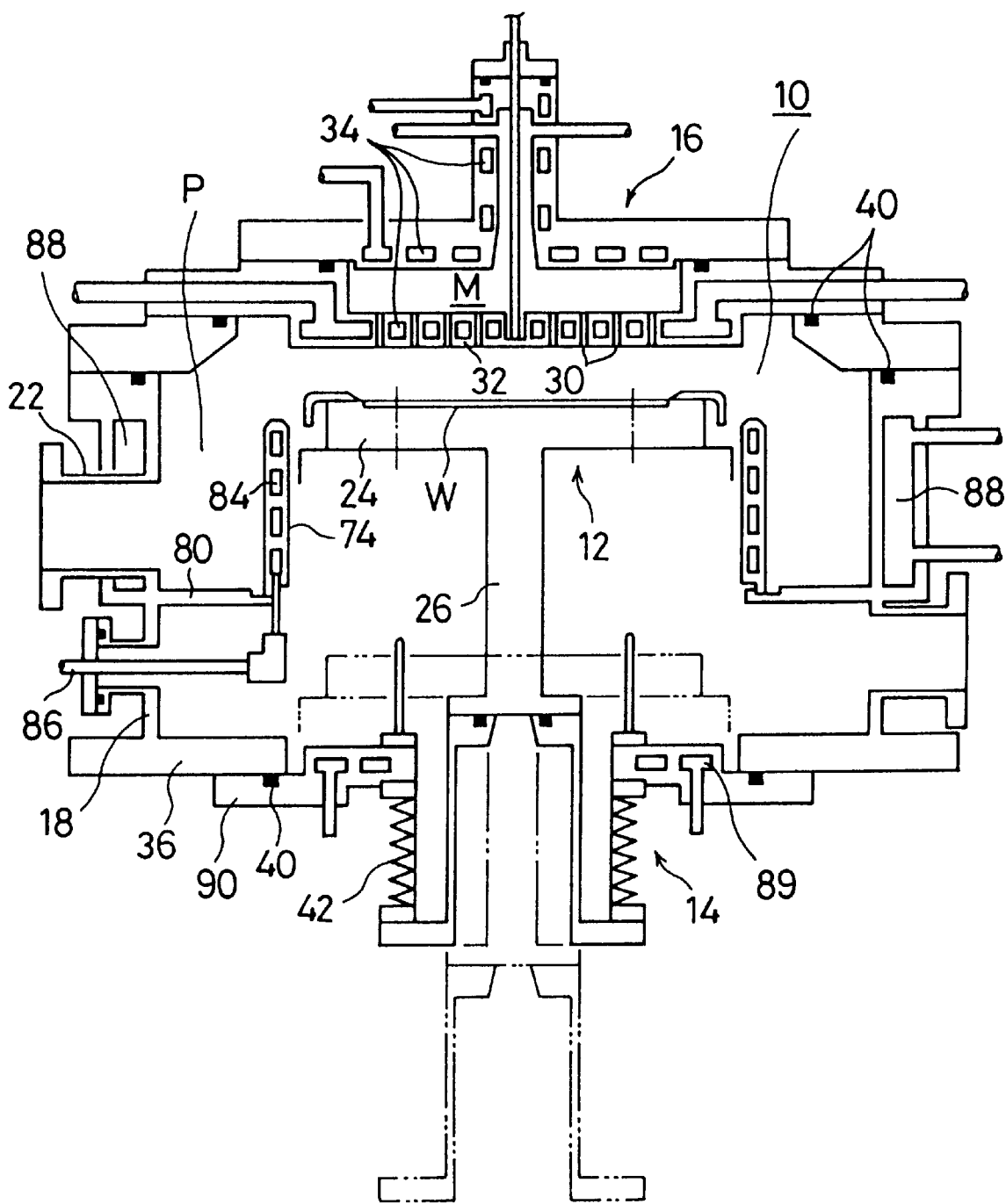
FIG. 7 is cross sectional view of a seventh embodiment of the thin-film deposition chamber of the present invention.

FIG. 7 shows a seventh embodiment of the thin-film deposition apparatus. In this case, heating of the wall section 18 and the elevator flange 90, fixed to the bottom plate 36, by radiation from the substrate holder 12 is prevented by providing a jacket 88 for cooling the wall section 18, and a jacket 89 for cooling the elevator flange 90. In addition to the thermal barrier effects provided by the insulator member 74, these provisions further assure the interior temperature of the chamber 10 is maintained at a temperature lower than the deposition reaction temperature. Such measures ultimately provide improved life of sealing members and consequently the safety of the workers.

Figure 8A:
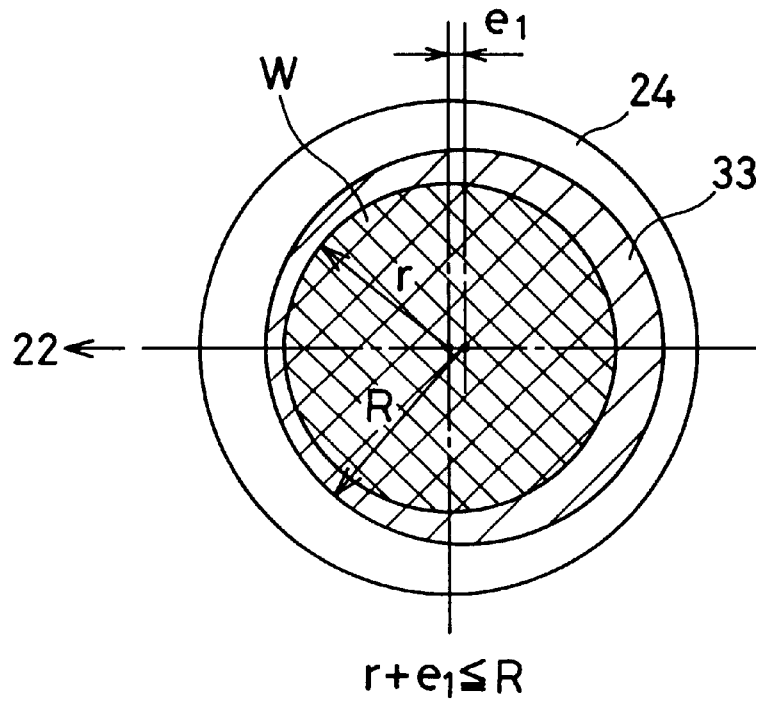
FIG. 8A and 8B are partial plan views of eighth and ninth embodiments of the thin-film deposition chamber of the present invention.
Figure 8B:
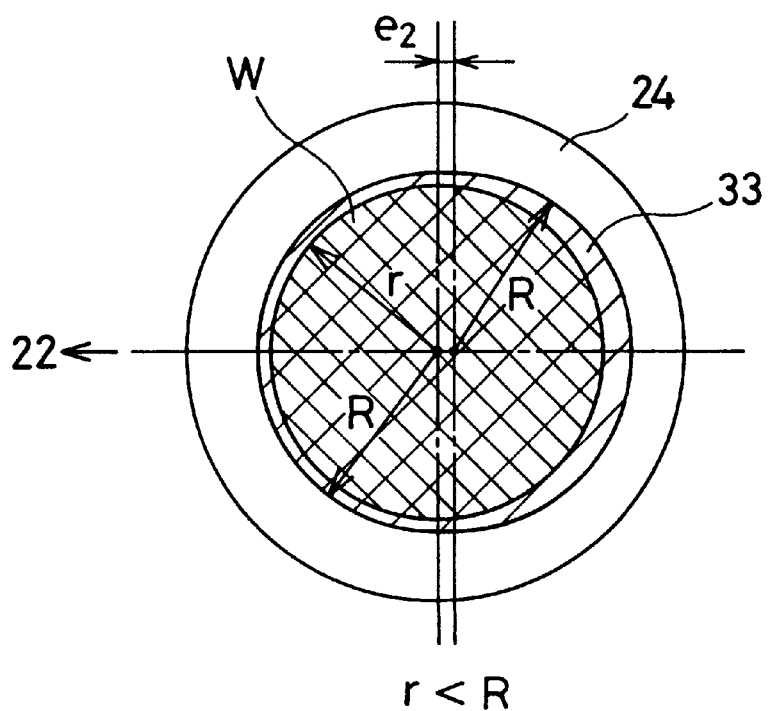

FIGS. 8A, 8B show eighth and ninth embodiments of the thin-film deposition apparatus. In the case shown in FIG. 8A, a center P of a nozzle region 33 of the gas showering head 16 is offset by e1 from a center O of the substrate W held on the susceptor 24 against the exhaust opening 22. This arrangement can be used in conjunction with any of the apparatuses shown in FIGS. 1 to 7. In the case shown in FIG. 8A, the nozzle region 33 has a larger radius R than the substrate W, and in the case shown in FIG. 8B, the nozzle region 33 has a flat oval shape having two semicircles of a radius R with an offset by a distance e2. The size of the offsets $e_1$, $e_2$ should be chosen to suit the processing conditions so that uneven gas flow caused by asymmetrical location of the exhaust opening 22 is compensated for by such offset of the nozzle region 33. In all cases, the substrate W must reside within the shadow cast by the nozzle region 33.

Figure 9A:
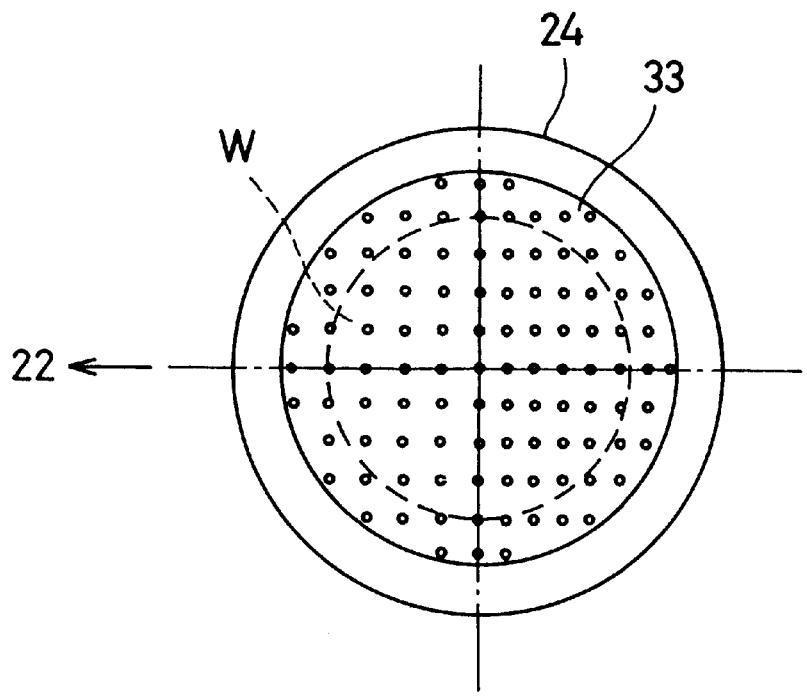
FIG. 9A and 9B are partial plan views of tenth and eleventh embodiments of the thin-film deposition chamber of the present invention.

FIG. 9A shows a tenth embodiment of the thin-film deposition apparatus. In this case, the distribution pattern of the nozzle holes 30 in the nozzle region 33 is altered in a half-side close to the exhaust opening 33 is altered in a half-side close to the exhaust opening 22 compared with the opposite half-side. Because only one exhaust opening 22 is provided to the chamber 10, a flow heading towards the exhaust opening 22 is developed on the substrate W. Therefore, if the distribution pattern of the nozzle holes 30 is designed to be symmetric, the gas flow density on the substrate W will become higher in the exhaust opening side than the opposite side. Thus, a larger number of gas ejection holes 30 are provided on the opposite half-side in the nozzle region 33 than on the exhaust opening half-side to equalize the gas flow density at both sides of the nozzle region 33. This type of gas ejection nozzle 16 can be used with any one of the apparatuses in FIGS. 1 to 7.

Figure 9B:
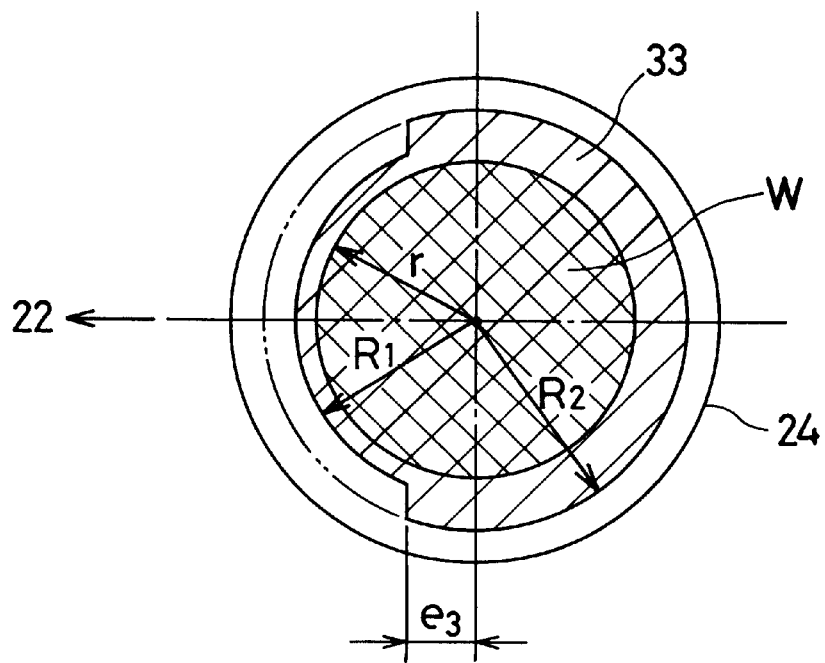

FIG. 9B shows an eleventh embodiment of the thin-film deposition apparatus, where the area of the nozzle region 33 is altered in a half-side close to the exhaust opening 22 compared with the opposite half-side. That is, the nozzle region 33 has a radius $R_1$ larger than the radius r of the substrate W on the exhaust opening half-side, and a radius $R_2$ larger than the radius $R_1$ on the opposite half-side. This feature also works for equalization of the gas flow density over the nozzle region 33. It also can be used with any one of the apparatuses shown in FIGS. 1 to 7.

What is claimed is:
1. A thin-film deposition apparatus comprising:
   a substrate holding device for holding a substrate;
   a vacuum-tight deposition chamber enclosing said substrate holding device;
   an elevator device to raise or lower said substrate holding device between a deposition position and a transport position;

a gas showering head for sending a film forming gas towards said substrate;

a transport opening provided on a wall section of said deposition chamber at a height corresponding to said transport position;

an exhaust opening provided on said wall section at a height between said deposition position and said transport position; and a flow guiding member provided within said deposition chamber, said flow guiding member comprising:

an inner flow guiding member having a cylindrical member surrounding an elevating path of said substrate holding device and a first ring member vertically dividing a chamber space at a height between said exhaust opening and said transport opening;

an outer flow guiding member disposed between said inner flow guiding member and an inner surface of said wall section of said deposition chamber to form an exhaust passage for gas together with said inner flow guiding member wherein said exhaust passage comprises an annular flow path to guide gas to said exhaust opening, said annular flow path being defined by said inner flow guiding member and said outer flow guiding member; and a second ring member disposed above said first ring member for dividing said annular flow path vertically so as to form a circumferential slit channel in said annular flow path.

2. An apparatus according to claim 1, wherein said circumferential slit channel is shaped such that a slit width in a vicinity of said exhaust opening is narrower than a slit width remote from said exhaust opening.

3. An apparatus according to claim 1, further comprising a cylindrical wall member surrounding said substrate holding device, said flow guiding member being provided on an outer circumference of said cylindrical wall member.

4. An apparatus according to claim 3, wherein said cylindrical wall member comprises an insulator member for suppressing radiation heat from said substrate holding device.

5. An apparatus according to claim 3, wherein said cylindrical wall member is provided with a temperature control device operable to control the temperature of said cylindrical wall member to a specific temperature.

6. An apparatus according to claim 3, wherein said cylindrical wall member is removably disposed in said deposition chamber.

7. An apparatus according to claim 1, further comprising a cooling device to cool said wall section of said deposition chamber to a temperature lower than a predetermined temperature.

8. An apparatus according to claim 1, wherein said inner flow guiding member and said outer flow guiding member are removably disposed in said deposition chamber.

9. An apparatus according to claim 1, wherein said cylindrical member and said first ring member are integrally formed.

10. An apparatus according to claim 1, wherein said gas showering head is operable to send the film forming gas towards said substrate such that a center of gas flow density of the film forming gas is offset in a direction opposite to said exhaust opening from a center of said substrate horizontally held on said substrate holding device.

11. An apparatus according to claim 10, wherein a center of a nozzle region of said gas showering head is offset in a direction opposite to said exhaust opening from a center of said substrate horizontally held on said substrate holding device.

12. An apparatus according to claim 10, wherein a nozzle region of said gas showering head has a nozzle hole distribution wherein a larger number of nozzle holes are provided on a half of said nozzle region opposite said exhaust opening than on another half of said nozzle region closest to said exhaust opening.

13. An apparatus according to claim 1, wherein said gas showering head is provided with a temperature control device for controlling the temperature of a nozzle region of said gas showering head at a predetermined temperature by using a thermal medium.

14. An apparatus according to claim 1, wherein said gas showering head has a nozzle region that is provided with a nozzle area larger than said substrate.

15. An apparatus according to claim 1, wherein said exhaust opening comprises a single exhaust opening.

16. An apparatus according to claim 1, wherein said exhaust opening is provided on said wall section at a circumferential position.

17. A thin-film deposition apparatus comprising:

a substrate holding device for holding a substrate;

a vacuum-tight deposition chamber enclosing said substrate holding device;

an elevator device to raise or lower said substrate holding device between a deposition position and a transport position;

a gas showering head for sending a film forming gas towards said substrate;

a transport opening provided on a wall section of said deposition chamber at a height corresponding to said transport position;

an exhaust opening provided on said wall section at a height between said deposition position and said transport position; and a flow guiding member provided within said deposition chamber, said flow guiding member comprising:

an inner flow guiding member having a cylindrical member surrounding an elevating path of aid substrate holding device and a first ring member vertically dividing a chamber space at a height between said exhaust opening and said transport opening;

an outer flow guiding member disposed between said inner flow guiding member and an inner surface of said wall section of said deposition chamber to form an exhaust passage for gas together with said inner flow guiding member, wherein said exhaust passage comprises an annular flow path to guide gas to said exhaust opening, said annular flow path being defined by said inner flow guiding member and said outer flow guiding member;

a second ring member disposed above said first ring member for dividing said annular flow path vertically so as to form a circumferential slit channel in said annular flow path; and a flow adjusting ring on said second ring member so that a size of said circumferential slit channel can be adjusted to produce a uniform flow over said substrate.

18. An apparatus according to claim 17, wherein said circumferential slit channel is shaped such that a slit width in a vicinity of said exhaust opening is narrower than a slit width remote from said exhaust opening.

19. An apparatus according to claim 17, further comprising a cylindrical wall member surrounding said substrate holding device, said flow guiding member being provided on an outer circumference of said cylindrical wall member.

20. An apparatus according to claim 19, wherein said cylindrical wall member comprises an insulator member for suppressing radiation heat from said substrate holding device.

21. An apparatus according to claim 19, wherein said cylindrical wall member is provided with a temperature control device operable to control the temperature of said cylindrical wall member to a specific temperature.

22. An apparatus according to claim 19, wherein said cylindrical wall member is removably disposed in said deposition chamber.

23. An apparatus according to claim 17, further comprising a cooling device to cool said wall section of said deposition chamber to a temperature lower than a predetermined temperature.

24. An apparatus according to claim 17, wherein said inner flow guiding member and said outer flow guiding member are removably disposed in said deposition chamber.

25. An apparatus according to claim 17, wherein said cylindrical member and said first ring member are integrally formed.

26. An apparatus according to claim 17, wherein said gas showering head is operable to send the film forming gas towards said substrate such that a center of gas flow density of the film forming gas is offset in a direction opposite to said exhaust opening from a center of said substrate horizontally held on said substrate holding device.

27. An apparatus according to claim 26, wherein a center of a nozzle region of said gas showering head is offset in a direction opposite to said exhaust opening from a center of said substrate horizontally held on said substrate holding device.

28. An apparatus according to claim 26, wherein a nozzle region of said gas showering head has a nozzle hole distribution wherein a larger number of nozzle holes are provided on a half of said nozzle region opposite said exhaust opening than on another half of said nozzle region closest to said exhaust opening.

29. An apparatus according to claim 17, wherein said gas showering head is provided with a temperature control device for controlling the temperature of a nozzle region of said gas showering head at a predetermined temperature by using a thermal medium.

30. An apparatus according to claim 17, wherein said gas showering head has a nozzle region that is provided with a nozzle area larger than said substrate.

31. An apparatus according to claim 17, wherein said exhaust opening comprises a single exhaust opening.

32. An apparatus according to claim 17, wherein said exhaust opening is provided on said wall section at a circumferential position.

* * * * *